United States Patent
Wilson et al.

Patent Number: 5,372,512
Date of Patent: Dec. 13, 1994

[54] ELECTRICAL INTERCONNECT SYSTEM FOR A FLEXIBLE CIRCUIT

[75] Inventors: Arthur K. Wilson, San Diego; Patricia S. Brown, Encinitas; Jason R. Arbeiter, Poway, all of Calif.

[73] Assignee: Hewlett-Packard Company, Palo Alto, Calif.

[21] Appl. No.: 56,692

[22] Filed: Apr. 30, 1993

[51] Int. Cl.$^5$ .............................................. H01R 9/09
[52] U.S. Cl. ...................................... 439/67; 439/493
[58] Field of Search ............... 346/1.1, 76 PH, 140 R; 361/398, 399, 421; 439/67, 77, 85, 493, 401

[56] References Cited

U.S. PATENT DOCUMENTS

| | | | |
|---|---|---|---|
| 4,403,272 | 9/1983 | Larson et al. | 439/85 X |
| 4,408,836 | 10/1983 | Kikuno | 439/85 X |
| 4,913,656 | 4/1990 | Gordon et al. | 439/67 |
| 5,158,466 | 10/1992 | Schreiber ett al. | 439/67 |
| 5,213,511 | 5/1993 | Sobhani | 439/67 |
| 5,273,440 | 12/1993 | Ashman et al. | 439/67 X |

FOREIGN PATENT DOCUMENTS

1443028  7/1976  United Kingdom .................. 439/67

*Primary Examiner*—Khiem Nguyen

[57] ABSTRACT

An improved electrical interconnect system for a flexible circuit which includes: a flexible first layer; at least one protrusion on the flexible first layer that has an electrical contact; a second layer having at least one electrical contact; and a spring apparatus coupled to the flexible first layer and to the second layer for pressing the electrical contact on the protrusion on the flexible first layer to the electrical contact on the second layer to electrically connect the electrical contact on the protrusion to the electrical contact on the second layer. In a specific embodiment the spring apparatus for pressing the electrical contact on the protrusion of the flexible first layer to the electrical contact on the second layer includes relief for allowing the flexible first layer to deform during assembly of the improved electrical interconnect system for a flexible circuit. In an alternate specific embodiment the electrical contacts on the protrusions on the flexible first layer and the corresponding electrical contacts on the second layer are coated with gold. In another alternate specific embodiment the improved electrical interconnect system includes an alignment apparatus coupled to the flexible first layer and the second layer and the spring apparatus for aligning the flexible first layer with the second layer and the spring apparatus. The improved electrical interconnect system for a flexible circuit provides higher interconnect density, reduced cost and increased reliability compared to conventional interconnect systems.

10 Claims, 10 Drawing Sheets

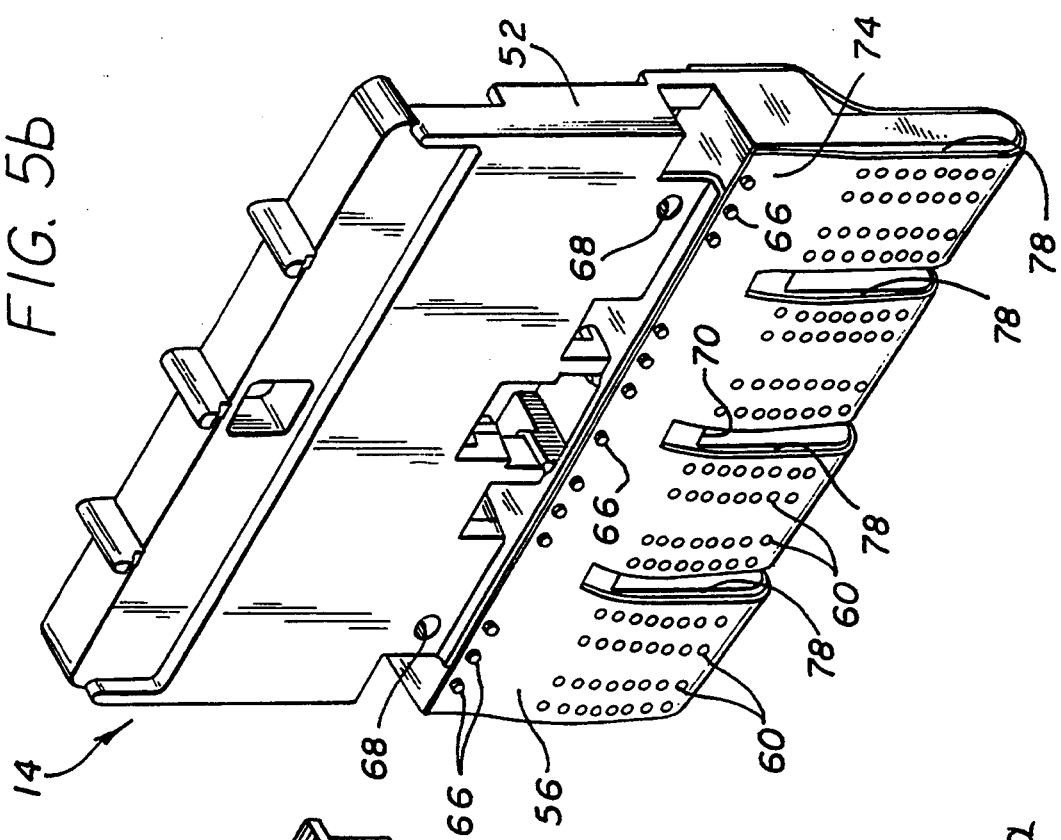
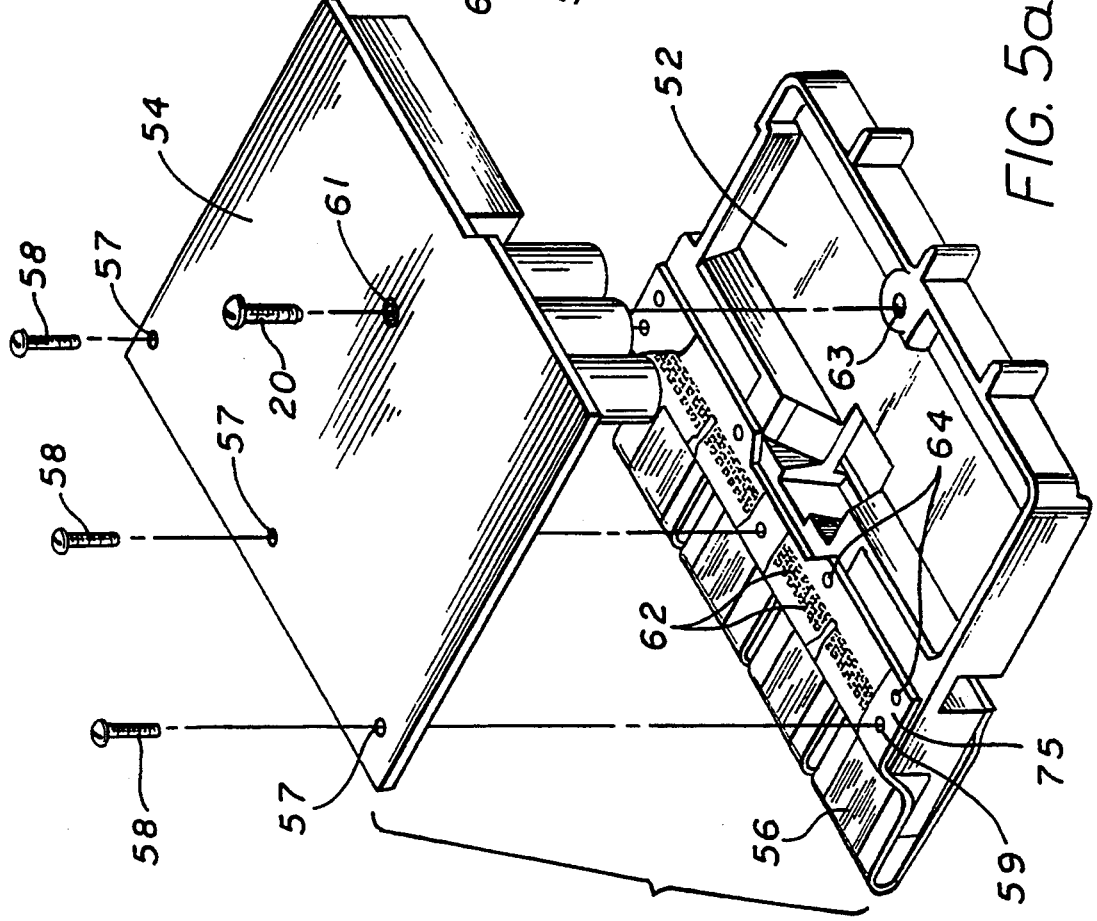

ELECTRICAL INTERCONNECT SYSTEM FOR A FLEXIBLE CIRCUIT

BACKGROUND OF THE INVENTION

1. Field of the Invention

This invention relates to electrical interconnect apparatus and more particularly to electrical interconnect apparatus between a flexible circuit and a printed circuit board.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Electrical interconnections between parts of an electronic system are often made with flexible circuits, which are conventionally made with a polyester or polyimid material such as a Mylar or Kapton substrate onto which multiple conductors are deposited. It is often necessary to interconnect the electrical contacts on a flexible circuit to electrical contacts on a rigid printed circuit board. A high interconnect density, which is the number of interconnects per square area, is very desirable, because miniaturization of electronics is increasing requiring higher interconnect density.

There are a number of conventional approaches to accomplish the interconnection between a flexible circuit and a printed circuit board. One conventional approach is to simply solder the flexible circuit to the printed circuit board (PCB). This approach, however, has the disadvantages of: 1) low interconnect density, because it is necessary to maintain the spacing between interconnects to prevent solder bridging, and 2) the need to use Kapton, which is more tolerant to heat than Mylar. With this technique assembly and disassembly are inconvenient.

A second conventional approach is to solder a connector to the flexible circuit for connection with a connector soldered onto the PCB. This approach is easy to assemble and disassemble, but requires a connector on both the printed circuit board and the flexible circuit. In addition it requires a stiffener to be attached to the flexible circuit to support the connector, which increases the cost. It also has the disadvantage of achieving only low interconnect density.

A third conventional approach uses high pressure to force the flat contacts of a flexible circuit onto the contacts of a printed circuit board. This approach has the disadvantage that a rigid structure is required to support the high pressure. In addition, this approach is limited in that it requires the contacts on the PCB to be above the surface of the PCB. Often a coating such as a solder mask is applied over a PCB to protect the conductors from solder bridging and moisture. This coating leaves the exposed contacts on the PCB slightly recessed below the surface of the PCB, which makes connection with the contacts difficult. The high pressure approach also has the disadvantage of high cost.

A fourth conventional approach is to use spring fingers which are soldered onto the PCB. The flexible circuit is pressed onto the spring fingers to make contact. This approach has the shortcomings of high cost and low interconnect density, because of the space requirements for soldering the spring fingers to the PCB.

Another technique that has been used is called a zebra stripe and consists of an elastomer having alternating conductive and nonconductive sections. The zebra stripe is placed between a flexible circuit and a PCB and then the entire assembly is pressed together to complete the interconnect. This approach has the shortcomings of low interconnect density, high cost, and low reliability.

Accordingly, there is a need in the art for an improved interconnect system that provides higher interconnect density, reduced cost and increased reliability compared to conventional interconnect systems and which is also easy to assemble and disassemble.

SUMMARY OF THE INVENTION

The need in the art is addressed by an improved electrical interconnect system for a flexible circuit of the present invention. The inventive system includes a flexible first layer, at least one protrusion on the flexible first layer that has an electrical contact, a second layer having at least one electrical contact and a spring apparatus coupled to the flexible first layer and to the second layer for pressing the electrical contact on a protrusion on the flexible first layer to the electrical contact on the second layer to electrically connection the electrical contact on the protrusion to the electrical contact on the second layer.

In a specific embodiment the spring apparatus for pressing the electrical contact on the protrusion of the flexible first layer to the electrical contact on the second layer includes relief for allowing the flexible first layer to deform during assembly of the improved electrical interconnect system for a flexible circuit.

In an alternate specific embodiment the electrical contacts on the protrusions on the flexible first layer and the corresponding electrical contacts on the second layer are coated with gold.

In another alternate specific embodiment the improved electrical interconnect system includes an alignment apparatus coupled to the flexible first layer and the second layer and the spring apparatus for aligning the flexible first layer with the second layer and the spring apparatus.

The improved electrical interconnect system of the present invention provides higher interconnect density, reduced cost and increased reliability compared to conventional interconnect systems, The improved electrical interconnect system is also easy to assemble and disassemble.

BRIEF DESCRIPTION OF THE DRAWINGS

FIG. 1b is illustrative of an inkjet pen used in the inkjet desktop printer of FIG. 1a.

FIG. 1c is illustrative of a carriage assembly used in the inkjet desktop printer of FIG. 1a.

FIGS. 5a and 5b are illustrative diagrams showing the assembly of a unitary frame with a circuit board and unitary interconnect to form a removable frame circuit assembly in accordance with the present invention.

DESCRIPTION OF THE INVENTION

Illustrative embodiments and exemplary applications will now be described with reference to the accompanying drawings to disclose the advantageous teachings of the present invention.

Figure 1A:
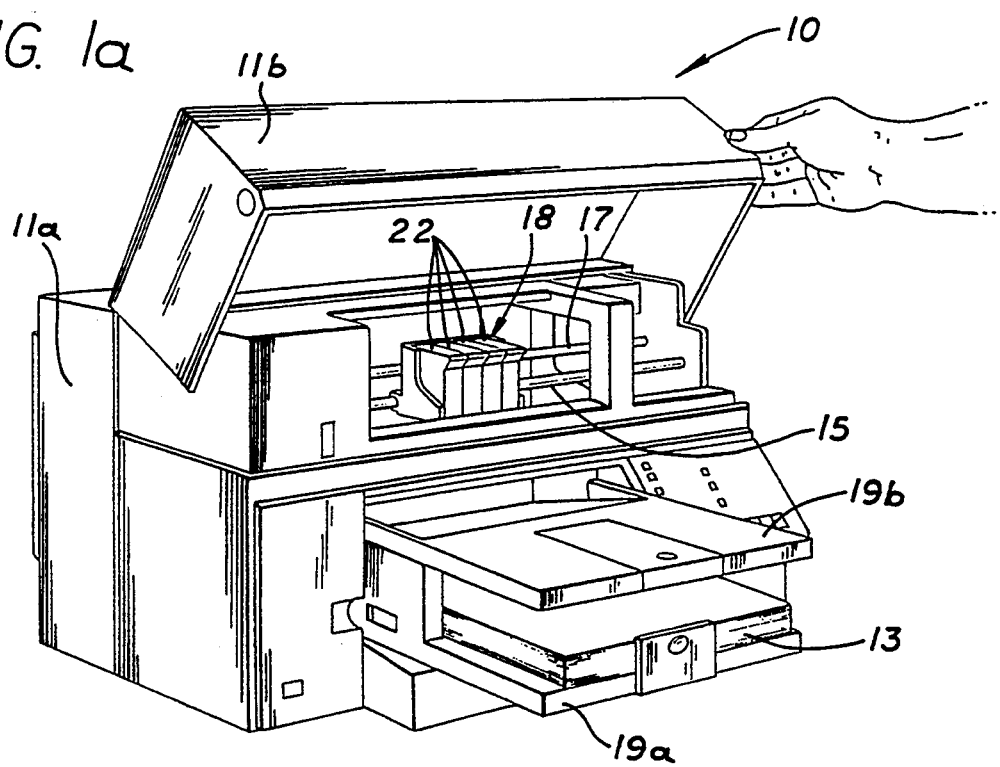
FIG. 1a is a perspective view of a thermal inkjet desktop printer incorporating the teachings of the present invention.

FIG. 1a is a perspective view of a thermal inkier desktop printer incorporating the teachings of the present invention. The printer 10 includes a housing 11a and a protective front access lid 11b. A carriage assembly 18, which has four inkjet pens 22, is adapted for reciprocal motion along carriage bar 15. The position of the carriage assembly 18 in the carriage scan axis along carriage bar 15 is determined by a carriage positioning mechanism (not shown) on the carriage assembly 18 that senses its position relative to carriage encoder strip 17. An input tray 19a holds a media input stack 13 and after printing, the printed media is held by an output tray 19b.

Figure 1B:
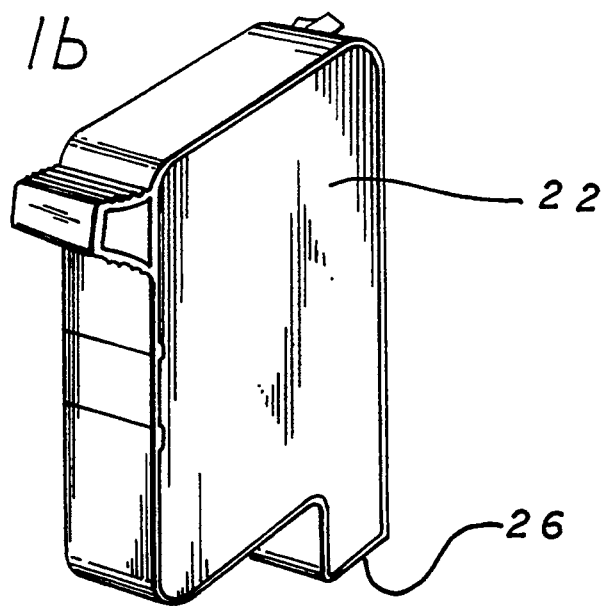
Figure 1C:
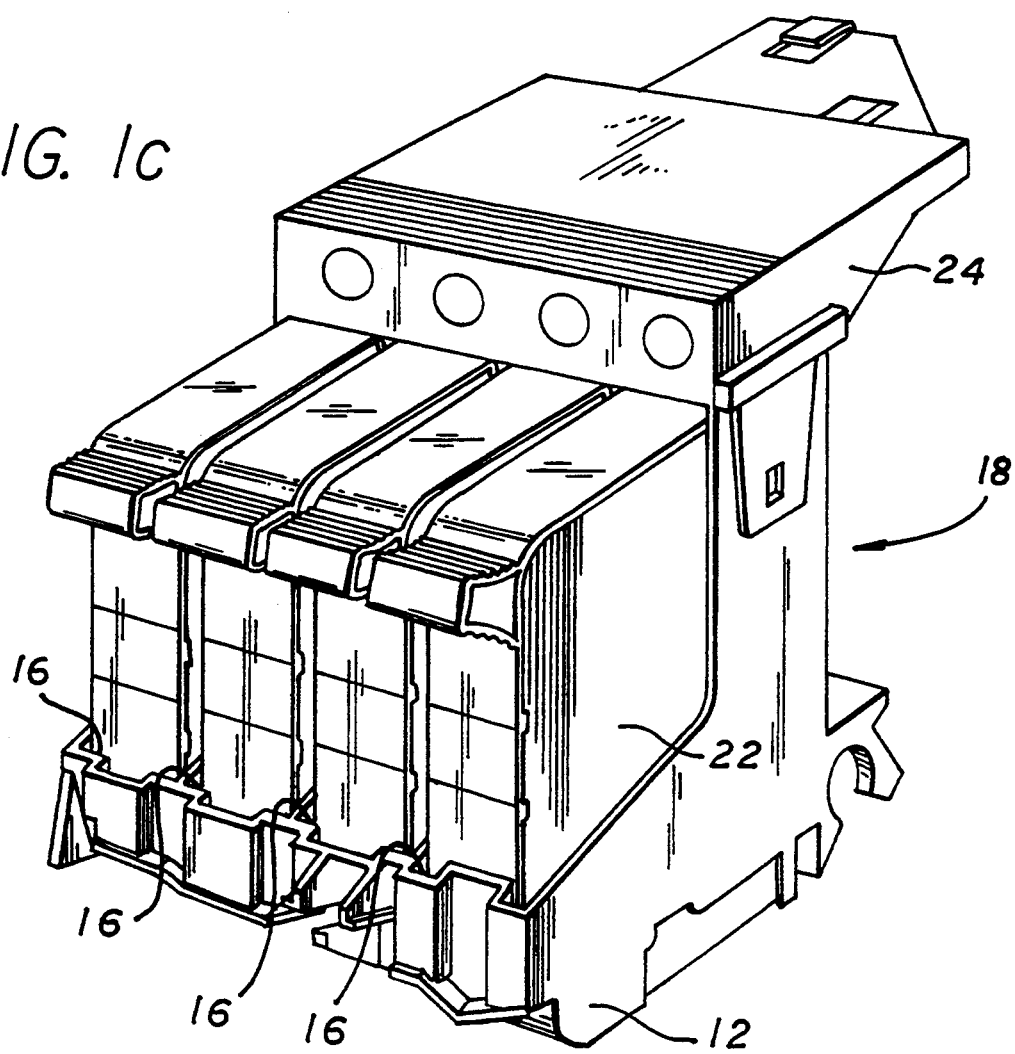

A color inkjet printer/plotter typically has four inkjet pens 22, one that stores black ink, and three that store colored inks, e.g., magenta, cyan and yellow. The colors from the three color pens are mixed to obtain any particular color. FIG. 1b is a detailed illustration of an inkjet pen 22 that includes heater circuits, which when activated cause ink to be ejected from the inkjet pen 22 at end 26. FIG. 1c illustrates carriage assembly 18 including four inkjet pens 22 installed in four pen stalls 16 in unitary housing 12 with cover 24 placed on top.

Figure 2A:
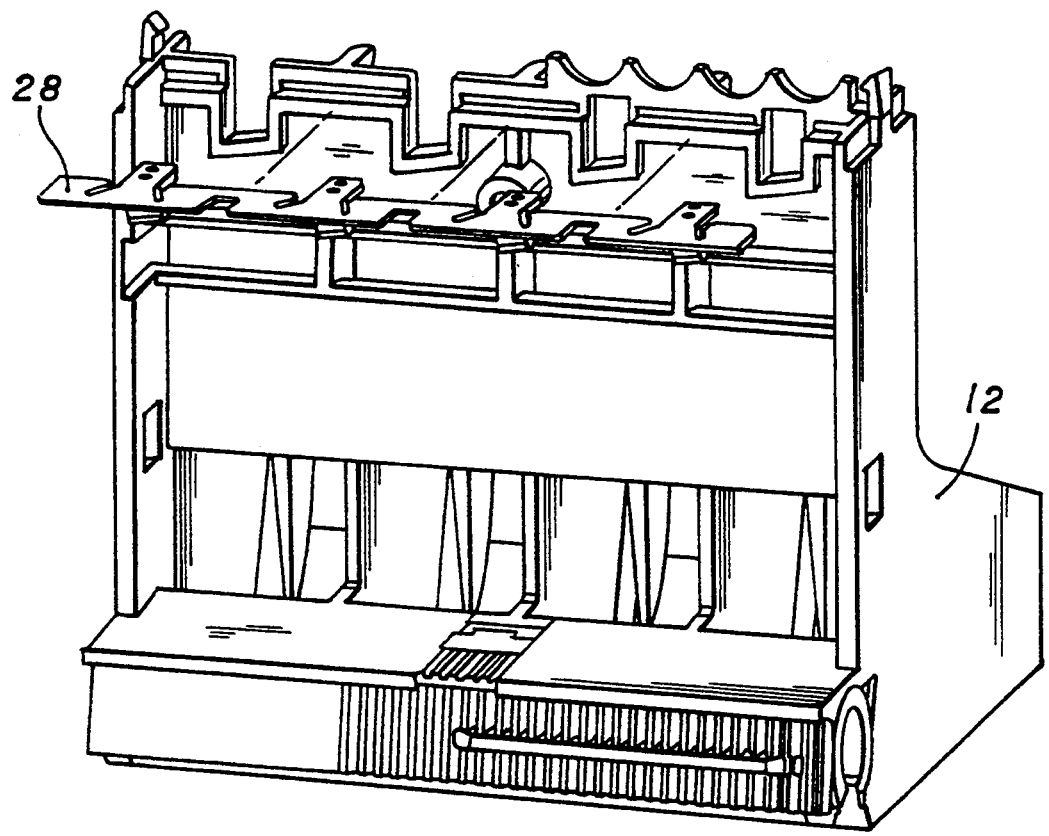
FIGS. 2a and 2b are illustrative diagrams showing spring mechanisms for clamping the inkjet pens in a unitary housing in accordance with the present invention.
Figure 2B:
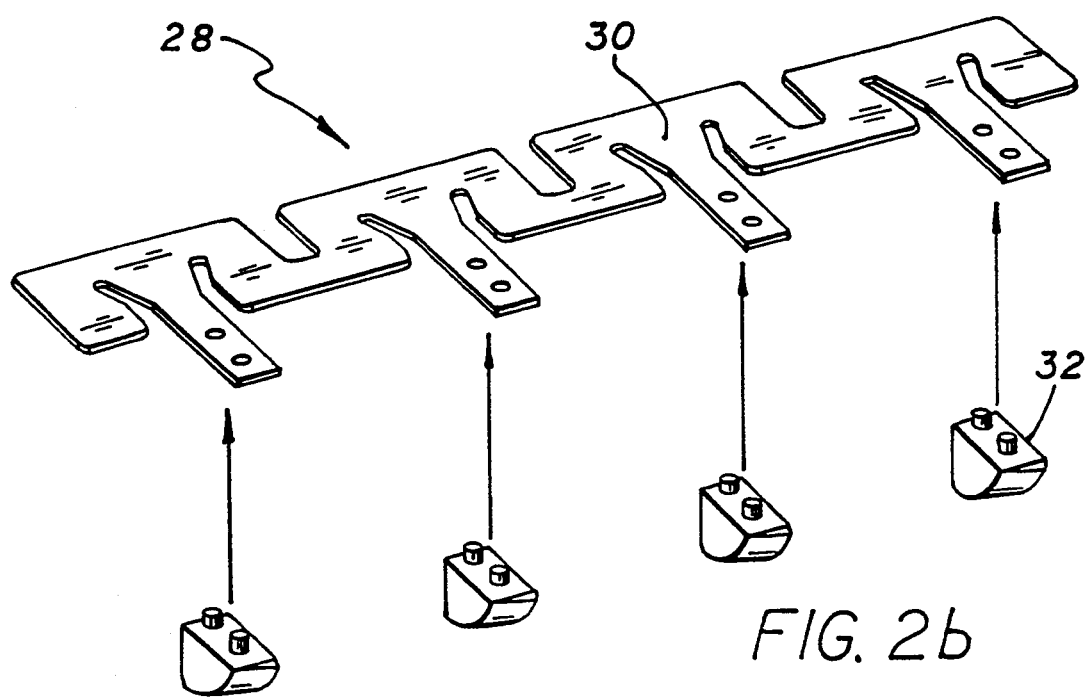

The inkjet pens 22 are held in unitary housing 12 by unitary spring clamp assembly 28, which is installed onto unitary housing 12, as shown in FIG. 2a. The tops of the inkjet pens 22 are retained by cam clamps 32 on unitary spring clamp assembly 28 when the inkjet pens 22 are inserted into unitary housing 12. FIG. 2b shows the position of cam clamps 32 on spring 30 to form unitary spring clamp assembly 28.

Figure 3A:
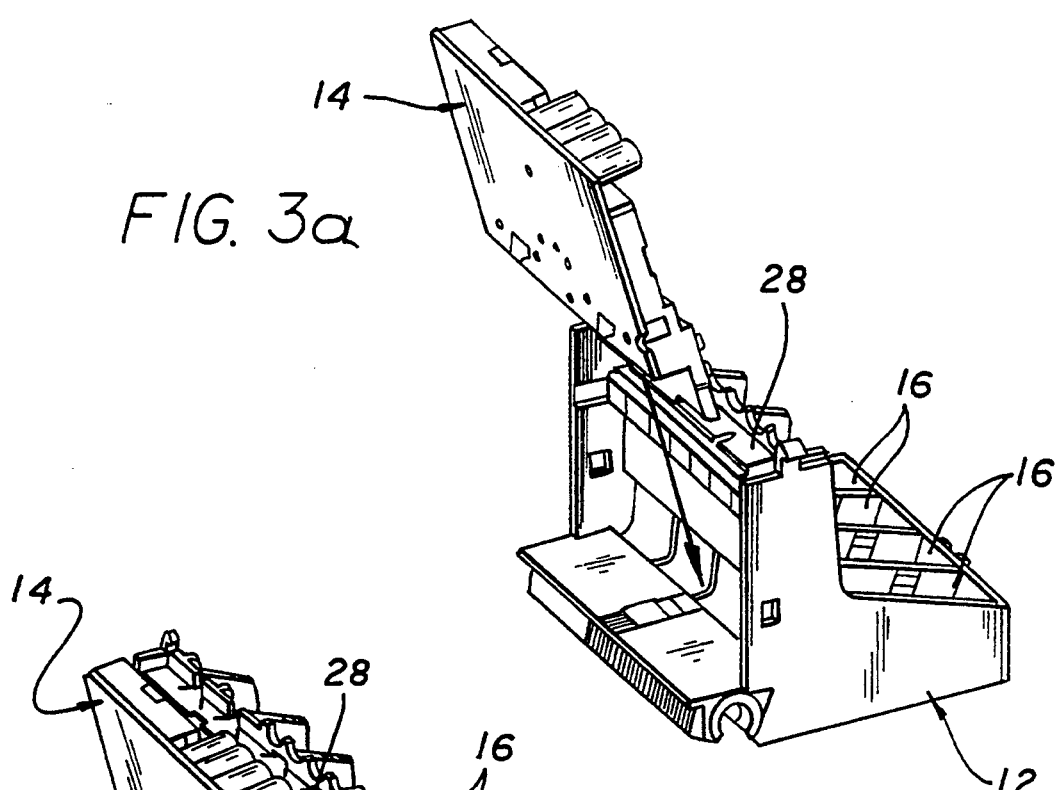
FIG. 3a is an illustration of a removable frame circuit constructed in accordance with the teachings of this invention and a unitary housing.
Figure 3B:
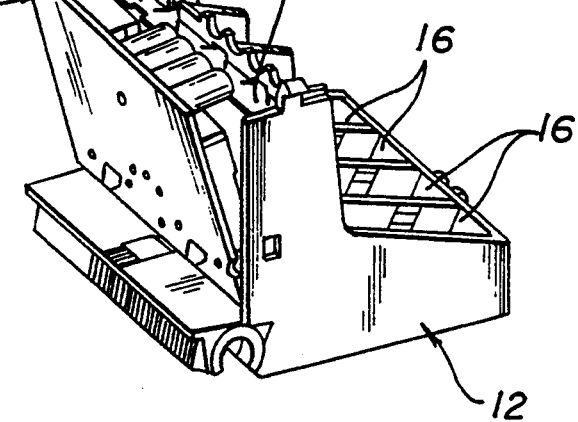
FIG. 3b illustrates the removable frame circuit of FIG. 3a being coupled to a unitary housing.
Figure 3C:
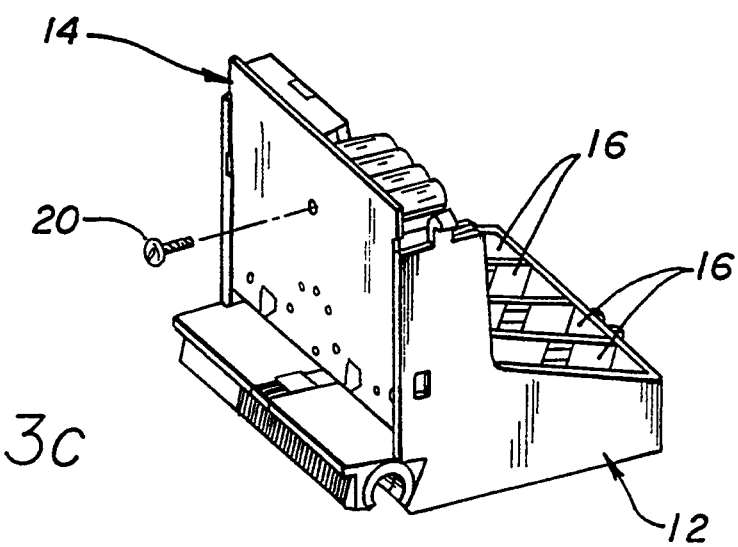
FIG. 3c shows the removable frame circuit of FIG. 3a coupled to a unitary housing.

After unitary clamp assembly 28 is installed onto unitary housing 12, as shown in FIG. 2a, then removable frame circuit assembly 14 is placed into unitary housing 12, as shown in FIGS. 3a and 3b. Removable frame circuit assembly 14 is fastened to unitary housing 12 with a single attachment device 20, as shown in FIG. 3c.

Figure 4:
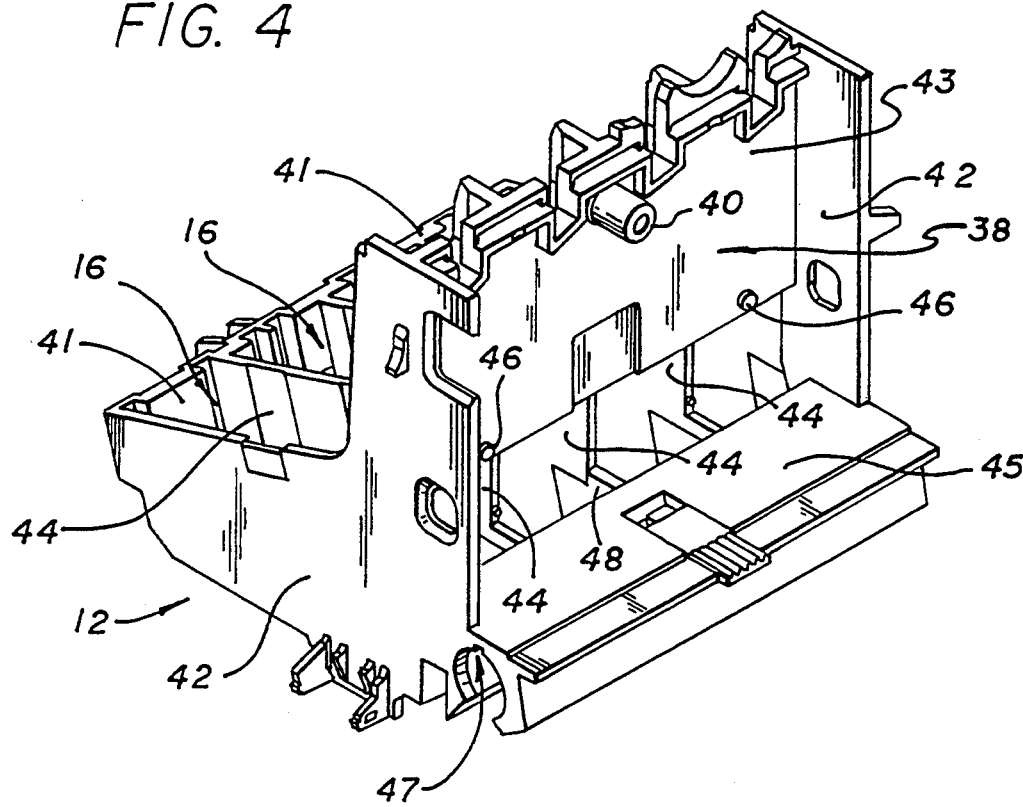
FIG. 4 is an illustrative diagram showing a unitary housing in accordance with the present invention.

FIG. 4 is an illustrative diagram showing a detailed view of the unitary housing 12 in accordance with the present invention. The unitary housing 12 is a one piece construction and retains the inkjet pens in a fixed relation to each other and the inkjet printer. A first portion 47 integral to the unitary housing extends along a third first axis and is adapted to engage the carriage bar 15. The pen stalls 16 each extend along a second axis and are substantially transverse to and integral with the first portion 47. Rear compartment 38, extending along a third axis, is substantially transverse to and integral with the first and second portions and adapted to retain a substantially planar frame circuit assembly 14 within a plane defined by the first and third axes. The unitary housing provides a substantially smaller carriage assembly than the prior art.

The unitary housing 12 has a front wall 41, two lateral walls 42, three pen stall walls 44, and rear wall 43, which form four pen stalls 16. It also has a rear compartment 38 formed by lateral walls 42, rear wall 43, base 45, and the spaces between pen stall walls 44 closest to base 45. The four pen stalls 16 have passages that communicate to the rear stall between rear wall 43 and base 45 and between the pen stall walls 44. The removable frame circuit assembly 14 is installed into the rear compartment 38 in unitary housing 12, as shown in FIGS. 3a–3c. The single attachment device 20, which can be a simple screw, mates with single attachment point 40 on unitary housing 12 to attach removable frame circuit assembly 14 to unitary housing 12.

The removable frame circuit assembly 14 should be properly aligned to the unitary housing 12 because electrical contacts on the inkjet pens must make proper electrical contact with electrical contacts on the removable frame circuit assembly 14 when the pens are mounted in the pen stalls 16. The alignment of removable frame circuit assembly 14 to unitary housing 12 is provided by two vertical alignment pins 46 for vertical alignment and by single horizontal alignment wall 48 for horizontal alignment. The vertical alignment pins 46 mate with alignment holes 68 on removable frame circuit assembly 14, shown in FIG. 5b. The single horizontal alignment wall 48 is a vertical wall in unitary housing 12. Alignment slot 70 on removable frame circuit assembly 14, shown in FIG. 5b, slides over and aligns to single horizontal alignment wall 48 when the removable frame circuit assembly 14 is assembled with unitary housing 12.

Figure 7:
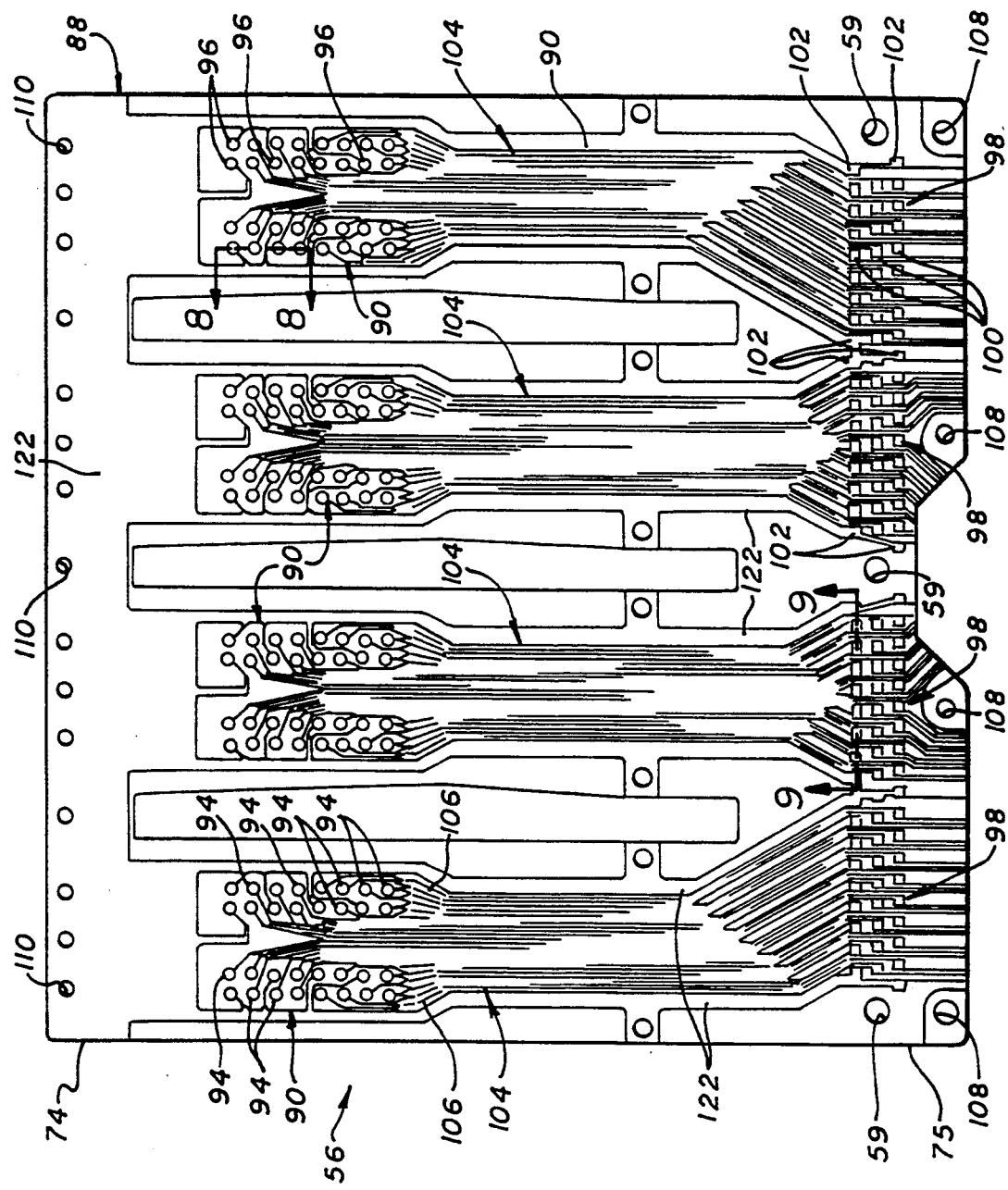
FIG. 7 is an illustrative diagram of a unitary interconnect system constructed in accordance with the present invention.

FIGS. 5a and 5b are illustrative diagrams showing the assembly of a unitary frame 52 with circuit board 54 and unitary interconnect 56 to form removable frame circuit assembly 14 in accordance with the present invention. The unitary interconnect 56 is aligned to unitary frame 52 by alignment pins 64 and unitary interconnect alignment pins 66 on unitary frame 52 that fit into alignment holes 108 and alignment holes 110, respectively, on unitary interconnect 56 as shown in FIG. 7. The unitary interconnect 56 is wrapped over extensions 78 on one end of unitary frame 52. When the frame circuit assembly 14 is installed into unitary housing 12, extensions 78 slide into the passages between pen stall walls 44 and rear wall 43 and behind base 45. This positions electrical contacts 60 for interconnection with electrical contacts on the inkjet pens 22.

The unitary interconnect 56 provides a shorter interconnect between the inkjet pens 22 and the circuit board 54 than the separate flexible circuits for each inkjet pen of the prior art. This is partially a result the substantially smaller carriage assembly provided by unitary housing 12.

The unitary interconnect 56 has two areas of electrical contacts: electrical contacts 60 on unitary interconnect first end 74 and electrical contacts 62 on unitary interconnect second end 75. The electrical contacts 62 interconnect with circuit board 54. The electrical contacts 60 are for electrical interconnection with the inkjet pens 22 held in pen stalls 16. As shown FIG. 5a, the circuit board 54 is attached to the unitary frame 52 with devices such as screws 58 that pass through circuit board attachment holes 57 and unitary interconnect holes 59 and into unitary frame 52. The single attachment device 20 passes through circuit board attachment hole 61 and unitary frame hole 63, when attaching removable frame circuit assembly 14 to unitary housing 12.

Figure 6A:
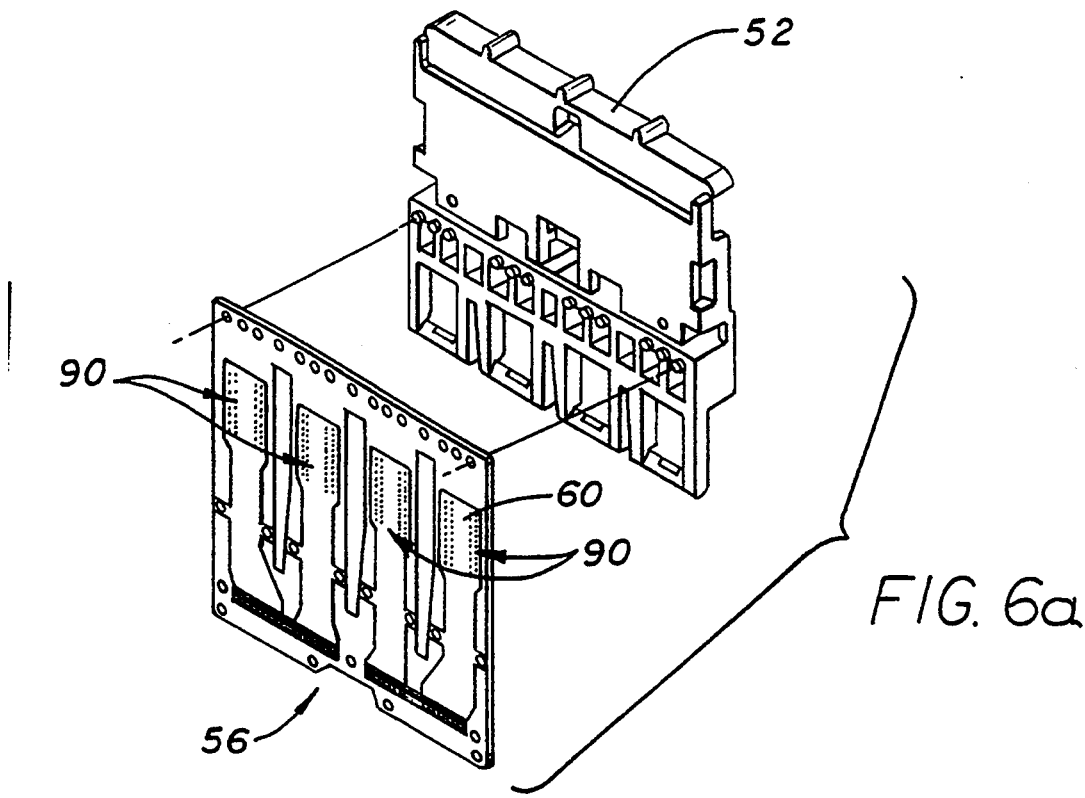
FIGS. 6a and 6b are illustrative diagrams showing the assembly of a unitary interconnect on a unitary frame with a circuit board to form a removable frame circuit assembly in accordance with the present invention.
Figure 6B:
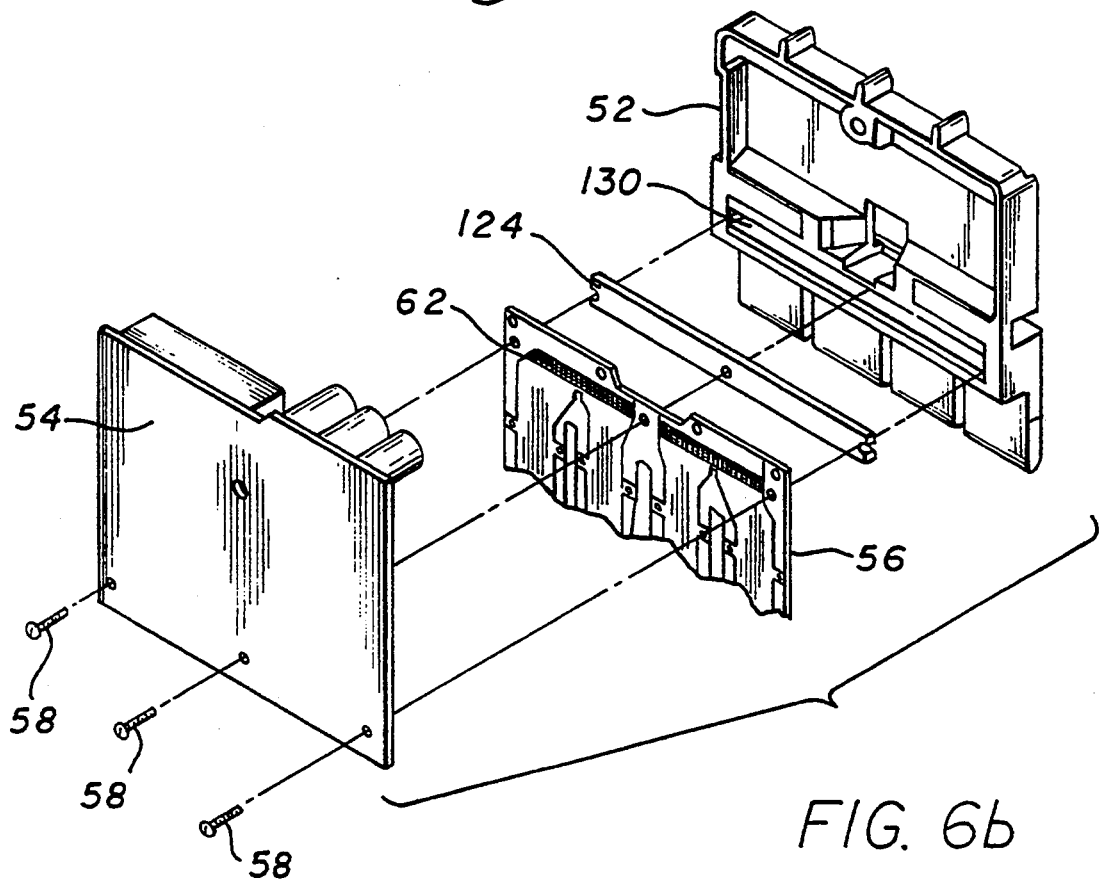

FIGS. 6a and 6b are illustrative diagrams showing the assembly of unitary interconnect 56 on unitary frame 52 and circuit board 54 to form a removable frame circuit assembly 14 in accordance with the present invention. As shown in FIG. 6a, the unitary interconnect 56 is first aligned and attached to unitary frame 52. Then, as shown in FIG. 6b, an elastomeric pad 124 is placed into recess 130 in unitary frame 52. The unitary interconnect 56 is then wrapped over one end of unitary frame 52 and the electrical contacts 62 are aligned onto unitary frame 52 and over the elastomeric pad 124. Finally, the circuit board 54 is attached to the unitary frame 52 to make electrical contact with electrical contacts 62 on unitary interconnect 56. The electrical interconnection of the unitary interconnect 56 with the circuit board 54 is described in further detail with reference to FIG. 10 later in this specification.

FIG. 7 is an illustrative detailed diagram of the unitary interconnect 56 constructed in accordance with the present invention. The unitary interconnect 56 includes substrate 88, which for convenience of description has a unitary interconnect first end 74 and a unitary interconnect second end 75. As discussed above, alignment holes 108 and alignment holes 110 on substrate 88 are provided for alignment with the unitary frame 52.

Along unitary interconnect first end 74 of substrate 88, four identical individual sets of electrical signal and ground contacts 90 are provided for interconnection to the signal contacts on an inkjet pen. In the illustrative embodiment, each identical individual set of electrical signal and ground contacts 90 in FIG. 7 has twenty three electrical signal contacts 94 and nine electrical ground contacts 96. The electrical contacts 60 of FIG. 5b are simplified representations off the electrical signal contacts 94 and electrical around contacts 96, as shown more accurately in FIG. 7.

Four individual sets of electrical signal contacts 98, which each have twenty three electrical signal contacts 100 are provided at unitary substrate second end 75 of substrate 88. The four individual sets of electrical traces 104, which each include twenty three electrical traces 106, interconnect the twenty three electrical signal contacts 94 of each of the identical individual sets of electrical signal and ground contacts 90 to the individual sets of electrical signal contacts 98. Sixteen total electrical ground contacts 102 are provided along the unitary interconnect second end 75 of substrate 88. The electrical contacts 62 of FIG. 5a are simplified representations of the electrical signal contacts 100 and electrical ground contacts 102, as shown more accurately in FIG. 7.

In an inkjet printer the number of heater circuits that are activated at any one time is determined by the pattern being printed. The advantage of the design of unitary interconnect 56 of the present invention is that a common conductive ground layer 122 is used to interconnect the nine electrical ground contacts 96 for each of the four identical individual sets of electrical signal and ground contacts 90 to all sixteen electrical ground contacts 102. Thus, a total of thirty six electrical ground contacts 96 are interconnected via common conductive ground layer 122 with sixteen electrical ground contacts 102. This addresses the problem of having limited interconnect area at unitary interconnect second end 75 for the electrical ground contacts 102 and allows sharing of all the electrical ground contacts 102 for the electrical ground contacts 96 of all of the inkjet pens. Thus, if a large number of heater circuits in one inkjet pen 22 are activated, that inkjet pen can use all sixteen electrical ground contacts 102 for a ground return. Sharing the ground contacts reduces ground fluctuations for the inkjet pens and improves performance. In a conventional device, a separate interconnect flexible circuit is provided for each inkier pen 22 and therefore separate ground returns for each inkjet pen. Thus, in the conventional device each inkjet pen has a reduced number of electrical ground contacts, which can cause ground fluctuations if a large number of heater circuits are activated in one inkjet pen.

Figure 8:
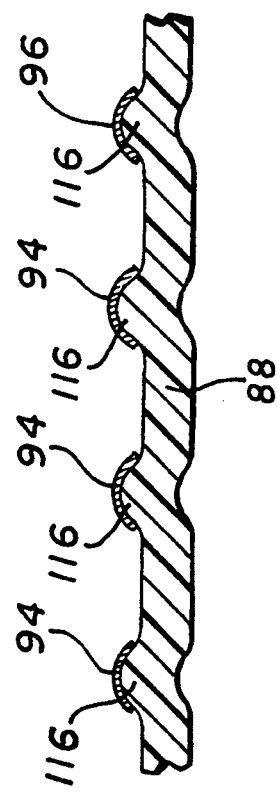
FIG. 8 is an illustrative diagram of section 8—8 of FIG. 7 showing protrusions on the unitary interconnect system for electrical signal and electrical ground contacts constructed in accordance with the present invention.
Figure 9:
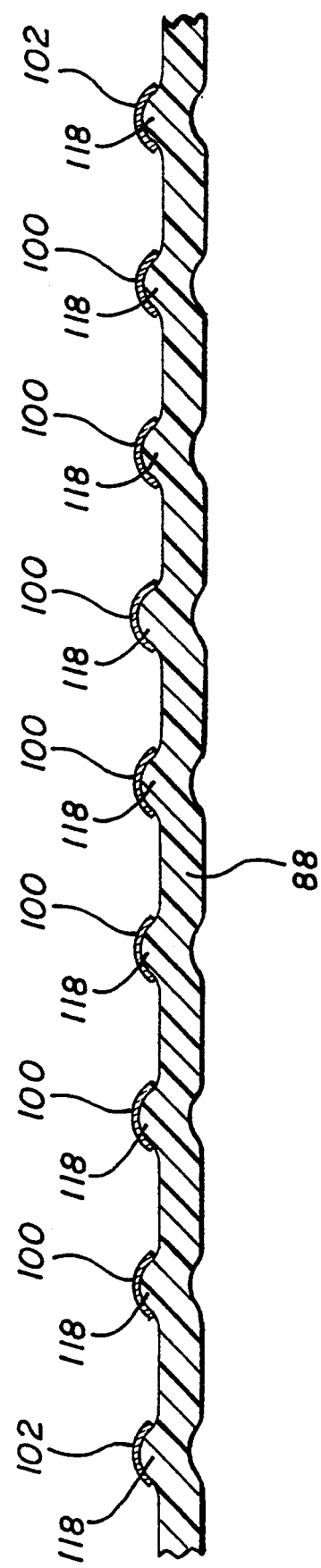
FIG. 9 is an illustrative diagram of section 9—9 of FIG. 7 showing protrusions on the unitary interconnect system for electrical signal and electrical ground contacts constructed in accordance with the present invention.

FIG. 8 is an illustrative diagram of section 8—8 of FIG. 7 showing protrusions 116 on substrate 88 constructed in accordance with the present invention. As shown in FIG. 8, electrical signal contacts 94 or electrical ground contacts 96 on protrusions 116. Similarly, FIG. 9 is an illustrative diagram of section 9—9 of FIG. 7 showing protrusions 118 on substrate 88. As shown in FIG. 9, electrical signal contacts 100 or electrical ground contacts 102 are provided on protrusions 118. The electrical contacts on protrusions 116 make contact with electrical contacts the inkjet pens 22 and the electrical contacts on protrusions 118 make contact with electrical contacts on circuit board 54.

Figure 10:
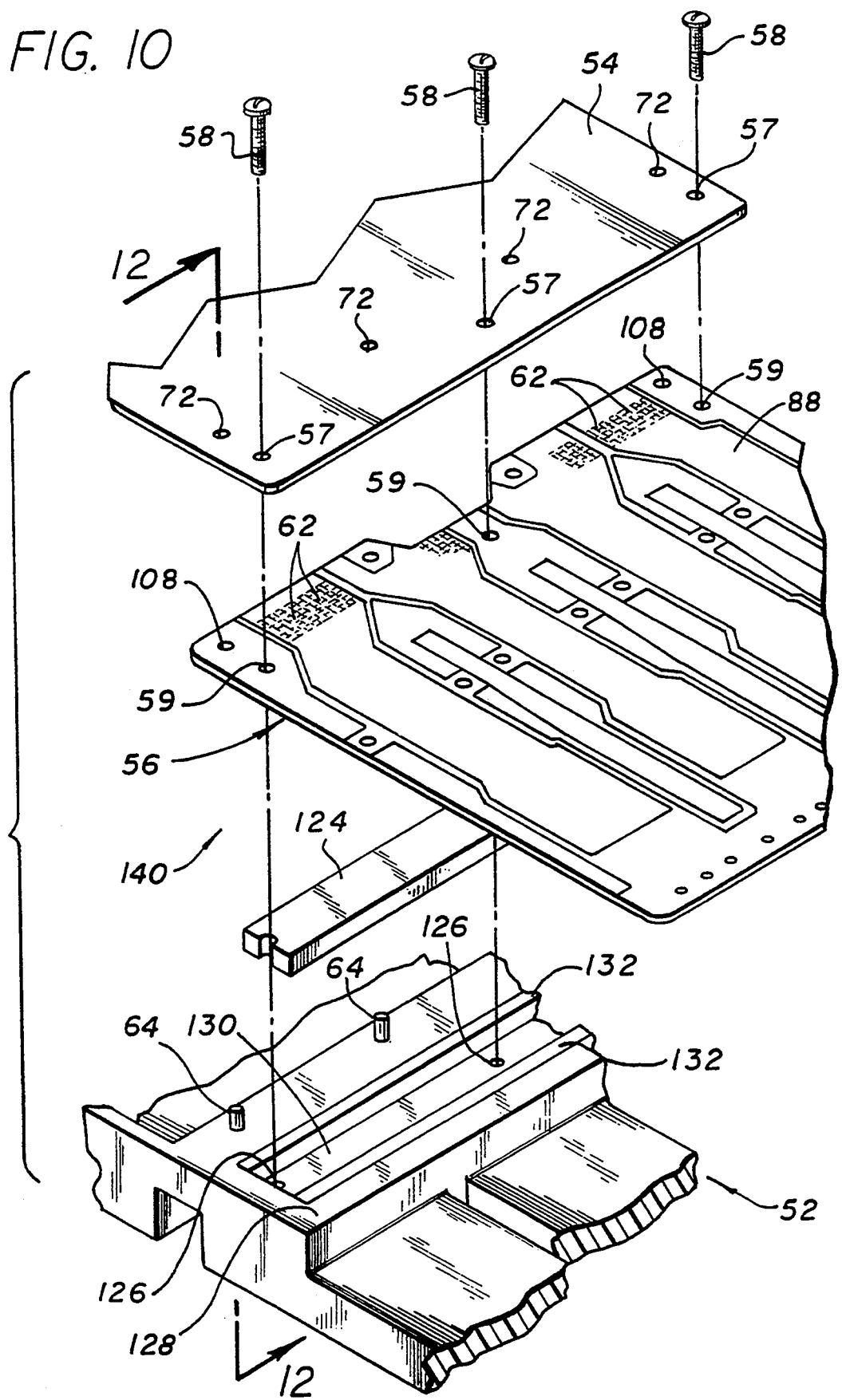
FIG. 10 is an illustrative diagram of a disassembled improved electrical interconnect system for a unitary interconnect in accordance with the present invention.

In FIG. 10 an improved electrical interconnect system 140 for a flexible circuit with a circuit board is shown. The unitary interconnect 56, shown in detail in FIG. 7, is constructed with a polyester or polyimide material such as Mylar or Kapton substrate 88 onto which multiple conductors are deposited. The conductors are made of copper and can be covered with another layer of Mylar or Kapton. Electrical contacts 62 are located on protrusions 118 on substrate 88, as shown in FIG. 9.

Figure 11:
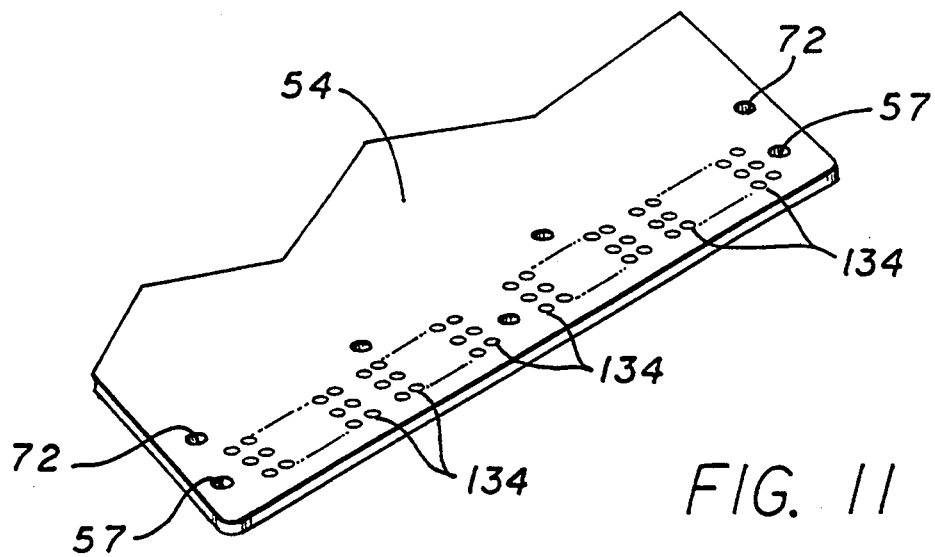
FIG. 11 is an illustrative diagram showing contacts on a circuit board corresponding to contacts on a unitary interconnect constructed in accordance with the present invention.

FIG. 11 shows the opposite side of circuit board 54 with circuit board contacts 134, which according to the present invention are interconnected with electrical contacts 62 on unitary interconnect 56. The arrangement of circuit board contacts 134 on circuit board 54 corresponds to the arrangement of electrical contacts 62 on unitary interconnect 56, which is shown in detail in FIG. 7. Each of the circuit board contacts 134 are gold plated and the electrical contacts 62 are also gold plated to insure a low resistance electrical path.

As shown in FIG. 10, the circuit board 54 and unitary interconnect 56 are assembled on a unitary frame 52, which can be constructed of plastic, because only low pressure is used to interconnect circuit board contacts 134 and electrical contacts 62. An elastomeric pad 124, which can be constructed of urethane rubber, provides a spring function and is mounted into recess 130 in unitary frame 52. The improved electrical interconnect system 140 is assembled with screws 58 that are inserted through circuit board attachment hole 57 on circuit board 54 and unitary interconnect holes 59 on unitary interconnect 56 and then screwed into attachment holes 126 on unitary frame 52. The electrical contacts 62 on unitary interconnect 56 are aligned to circuit board contacts 134 on circuit board 54 by alignment pins 64 coupled to unitary frame 52, which are inserted through alignment holes 108 on unitary interconnect 56 and alignment holes 72 on circuit board 54. When the improved electrical interconnect system is assembled the electrical contacts 62 are aligned and have electrical contact with circuit board contacts 134.

Figure 12:
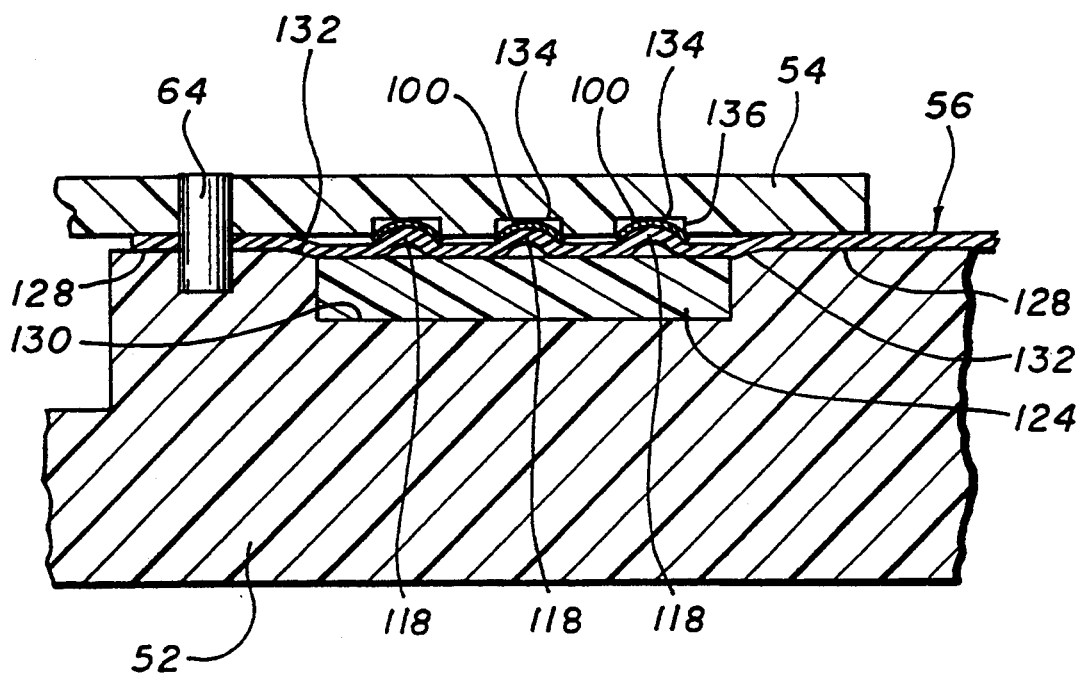
FIG. 12 is an illustrative diagram of an elevation section along line 12—12 of FIG. 10 of an assembled improved electrical interconnect system for a unitary interconnect constructed in accordance with the present invention.

FIG. 12 is an illustrative diagram of an elevation section along line 12—12 of FIG. 10 of an assembled improved electrical interconnect system for a flexible circuit constructed in accordance with the present invention. In FIG. 12 the elastomeric pad 124 is shown fit within recess 130 in unitary frame 52. The elastomeric pad 124 provides a spring function that bears upon the electrical contacts 100 on protrusions 118 between the elastomeric pad 124 and the circuit board 54. The unitary frame 52 has bevels 132 between the recess 130 and the top surface 128 of the unitary frame 52. The object of each bevel 132 is to provide relief allowing the unitary interconnect 56 to deform during assembly so that all of the electrical contacts 100 on protrusions 118 make contact with all of the circuit board contacts 134 on circuit board 54. As the screws 58 are tightened, a portion of the unitary interconnect 56 is clamped between the top surface 128 of unitary frame 52 and the circuit board 54. Bevels 132 provide relief to the portion of unitary interconnect 56 between elastomeric pad 124 and circuit board 54.

Also shown in FIG. 12 are circuit contact recesses 136, which contain circuit board contacts 134. The circuit contact recesses 136 on circuit board 54 are the result of a coating such as a solder mask that is applied over the conductors on circuit board 54 to protect the conductors from corrosion and to prevent solder bridging. This allows for slight circuit contact recesses 136 on the order of 0.001–0.002 inches deep at each of the circuit board contacts 134, which as discussed above are gold plated. During assembly, the portion of unitary interconnect 56 between elastomeric pad 124 and circuit board 54 deforms, which allows the protrusions 118 on unitary interconnect 56 to align with the circuit contact recesses 136 on circuit board 54 to ensure proper electrical contact.

The improved electrical interconnect system for a flexible circuit 140 is easy to assemble and disassemble by simply loosening or tightening screws 58. The interconnect density may exceed 150 contacts per square inch, which provides a high density interconnect system. These desirable features are obtained while maintaining low cost and high reliability.

The improved unitary interconnect system provides an interconnect system that reduces cost, is easier to assemble and align, and provides ground plane sharing for all of the inkjet pens.

The improved carriage assembly has reduced cost and is easier to assemble, align and service without the need for any special tools.

Thus, the present invention has been described herein with reference to a particular embodiment for a particular application. Nonetheless, those having ordinary skill in the art and access to present teachings will recognize additional modifications, applications, and embodiments within the scope thereof. For example, the alignment pins of the present invention may be replaced by other equivalent devices without departing from the scope of the present invention.

It is therefore intended by the appended claims to cover any and all such applications, modifications and embodiments within the scope of the present invention.

Accordingly,

What is claimed is:

1. An improved electrical interconnect system for a flexible circuit comprising:
   a flexible first layer;
   at least one protrusion on said flexible first layer having an electrical contact;
   a planar rigid second layer;
   at least one recessed electrical contact provided on a bottom surface of a rectangular recess formed on said second layer;
   spring means coupled to said flexible first layer and to said second layer for pressing said electrical contact on said protrusion on said flexible first layer to said electrical contact on said second layer; and
   wherein said electrical contact on said protrusion on said flexible first layer is electrically coupled to said electrical contact on said second layer.

2. The improved electrical interconnect system for a flexible circuit of claim 1 wherein said spring means for pressing said electrical contact on said protrusion on said flexible first layer to said electrical contact on said second layer further comprises relief means for allowing said flexible first layer to deform during assembly of said improved electrical interconnect system for a flexible circuit.

3. The improved electrical interconnect system for a flexible circuit of claim 2 wherein said spring means for pressing said electrical contact on said protrusion on said flexible first layer to said electrical contact on said second layer further comprises:
   a frame coupled to said flexible first layer and to said second layer; and
   pressure means coupled to said frame and to said first flexible layer for pressing said protrusion on said first flexible layer to said second layer;
   wherein said protrusion on said first flexible layer is between said second layer and said pressure means for pressing said protrusion on said first flexible layer to said second layer.

4. The improved electrical system for a flexible circuit of claim 3 wherein said relief means for allowing said flexible first layer to deform during assembly of said improved electrical interconnect system for a flexible circuit further comprises a relief area between said pressure means and said frame.

5. The improved electrical interconnect system for a flexible circuit of claim 4 wherein said relief area further comprises a bevel on said frame.

6. The improved electrical interconnect system for a flexible circuit of claim 5 wherein said pressure means for pressing said protrusion on said first flexible layer to said second layer further comprises an elastomeric pad mounted in a recess in said frame.

7. The improved electrical interconnect system for a flexible circuit of claim 1:
  wherein said electrical contact on said protrusion on said flexible first layer is coated with gold; and
  wherein said electrical contact on said second layer is coated with gold.

8. The improved electrical interconnect system for a flexible circuit of claim 1 further comprising alignment means coupled to said flexible first layer and said second layer and said spring means for aligning said flexible first layer with said second layer and said spring means.

9. The improved electrical interconnect system for a flexible circuit of claim 8 wherein said alignment means for aligning said flexible first layer with said second layer and said spring means further comprises:
  at least one alignment pin mounted on said frame;
  at least one alignment hole in said flexible first layer corresponding to said alignment pin and coupled to said alignment pin; and
  at least one alignment hole in said second layer corresponding to said alignment pin and coupled to said alignment pin.

10. An improved electrical interconnect system for a flexible circuit comprising:
  a flexible first layer;
  a plurality of protrusions each having an electrical contact on said flexible first layer;
  a planar rigid second layer having a plurality of recessed electrical contacts;
  a frame coupled to said flexible first layer and to said second layer;
  an elastomeric pad mounted into a recess in said frame and coupled to said flexible first layer for applying pressure to said plurality of protrusions on said flexible first layer;
  bevel means coupled to said frame for allowing said flexible first layer to deform during assembly of said improved electrical interconnect system for a flexible circuit;
  at least one alignment pin mounted on said frame;
  at least one alignment hole in said flexible first layer corresponding to said alignment pin and coupled to said alignment pin; and
  at least one alignment hole in said second layer corresponding to said alignment pin and coupled to said alignment pin;
  wherein said plurality of protrusions on said flexible first layer are located between said second layer and said elastomeric pad; and
  wherein said electrical contacts on said plurality of protrusions on said flexible first layer are electrically coupled to said electrical contacts on said second layer.

* * * * *